United States Patent [19] [11] 3,976,940
Chau et al. [45] Aug. 24, 1976

[54] TESTING CIRCUIT

[75] Inventors: Yuk Bun Chau, Fremont; Willis David Stinson, Jr., Saratoga, both of Calif.

[73] Assignee: Fairchild Camera and Instrument Corporation, Mountain View, Calif.

[22] Filed: Feb. 25, 1975

[21] Appl. No.: 552,910

[52] U.S. Cl. .......................... 324/73 R; 235/151.31; 235/153 AC
[51] Int. Cl.² .................. G01R 15/12; G01R 31/00
[58] Field of Search ................ 324/73 R, 73 AT; 235/153 AC, 151.31

[56] References Cited
UNITED STATES PATENTS

| 3,772,595 | 11/1973 | De Wolf et al. | 324/73 R |
|---|---|---|---|
| 3,832,535 | 8/1974 | De Vito | 235/153 AC |
| 3,849,726 | 11/1974 | Justice | 324/73 R |
| 3,851,161 | 11/1974 | Sloop | 235/151.3 |
| 3,882,386 | 5/1975 | vinsani | 324/73 R |

OTHER PUBLICATIONS
B394,712, Jan., 1975, Patti, 324/73 R

Primary Examiner—R. V. Rolinec
Assistant Examiner—Vincent J. Sunderdick
Attorney, Agent, or Firm—Alan H. MacPherson; Henry K. Woodward; J. Ronald Richbourg

[57] ABSTRACT

An improved testing circuit is provided which includes a pair of comparator circuits each of which is disposed for comparing two minimum threshold amplitudes of responses from a device under test, and a multiplexer circuit coupled to the outputs of the pair of comparator circuits for switching between the outputs of the pair of comparator circuits. The use of a pair of comparator circuits and a multiplexer circuit allows continuous operation of the comparators thereby providing accurate testing at high speeds of operation.

The improved testing circuit of this invention also includes a skew adjustment circuit which provides for adjustment of the leading and trailing edges of a test stimuli signal from one testing circuit with respect to the leading and trailing edges of test stimuli signals from other testing circuits incorporated in a circuit testing system. Undesired glitches have been substantially eliminated from the test stimuli signal by incorporation of an amplitude limiting circuit that mitigates the amplitude of switching signals used in generating the test stimuli signal.

8 Claims, 7 Drawing Figures

FIG. 6 COMPARATOR CIRCUIT

FIG. 7

TESTING CIRCUIT

FIELD OF THE INVENTION

This invention relates generally to a circuit tester and more particularly to a tester for providing a stimuli to and receiving responses from individual input and output terminals, respectively, of a high speed electronic circuit under test by stimulating the circuit and comparing the received responses with programmed predictions to provide an indication of proper functioning of the circuit.

PRIOR ART

Recent improvements of electronic circuitry with corresponding increases in speed of operation, has created a need for circuit testers capable of testing such circuitry. The prior art circuit testers have been limited to given frequencies of operation which can be less than or substantially less than the speed of operation of the circuits to be tested. To simply increase the speed of operation of the prior art circuit testers is insufficient because clock signals generated by the circuit tester normally do not have voltage level transitions sufficiently fast for high speed testing. And, the transition in voltage levels is not sufficiently clean and accurate enough for testing of high speed electronic devices.

The prior art testing system was capable of functionally testing devices at a rate of 5 megahertz. However, the new and improved circuit of the present invention is capable of testing devices at a rate of 10 megahertz as will be shown in greater detail hereinbelow.

SUMMARY OF THE INVENTION

In accordance with the present invention, an improved testing circuit is provided which includes a pair of comparator circuits each of which is disposed for comparing two minimum threshold amplitudes of responses from a device under test, and a multiplexer circuit coupled to the outputs of the pair of comparator circuits for switching between the outputs of the pair of comparator circuits. The use of a pair of comparator circuits and a multiplexer circuit allows continuous operation of the comparators thereby providing accurate testing at high speeds of operation.

The improved testing circuit of this invention also includes a skew adjustment circuit which provides for adjustment of the leading and trailing edges of a test stimuli signal from one testing circuit with respect to the leading and trailing edges of test stimuli signals from other testing circuits incorporated in a circuit testing system. Undesired glitches have been substantially eliminated from the test stimuli signal by incorporation of an amplitude limiting circuit that mitigates the amplitude of switching signals used in generating the test stimuli signal.

BRIEF DESCRIPTION OF THE DRAWINGS

FIG. 6 is a detailed schematic diagram of the comparator circuit employed in the testing circuit; and, FIG. 7 is a schematic diagram of the coil connections for relays employed in the testing circuit.

DETAILED DESCRIPTION

Figure 1:
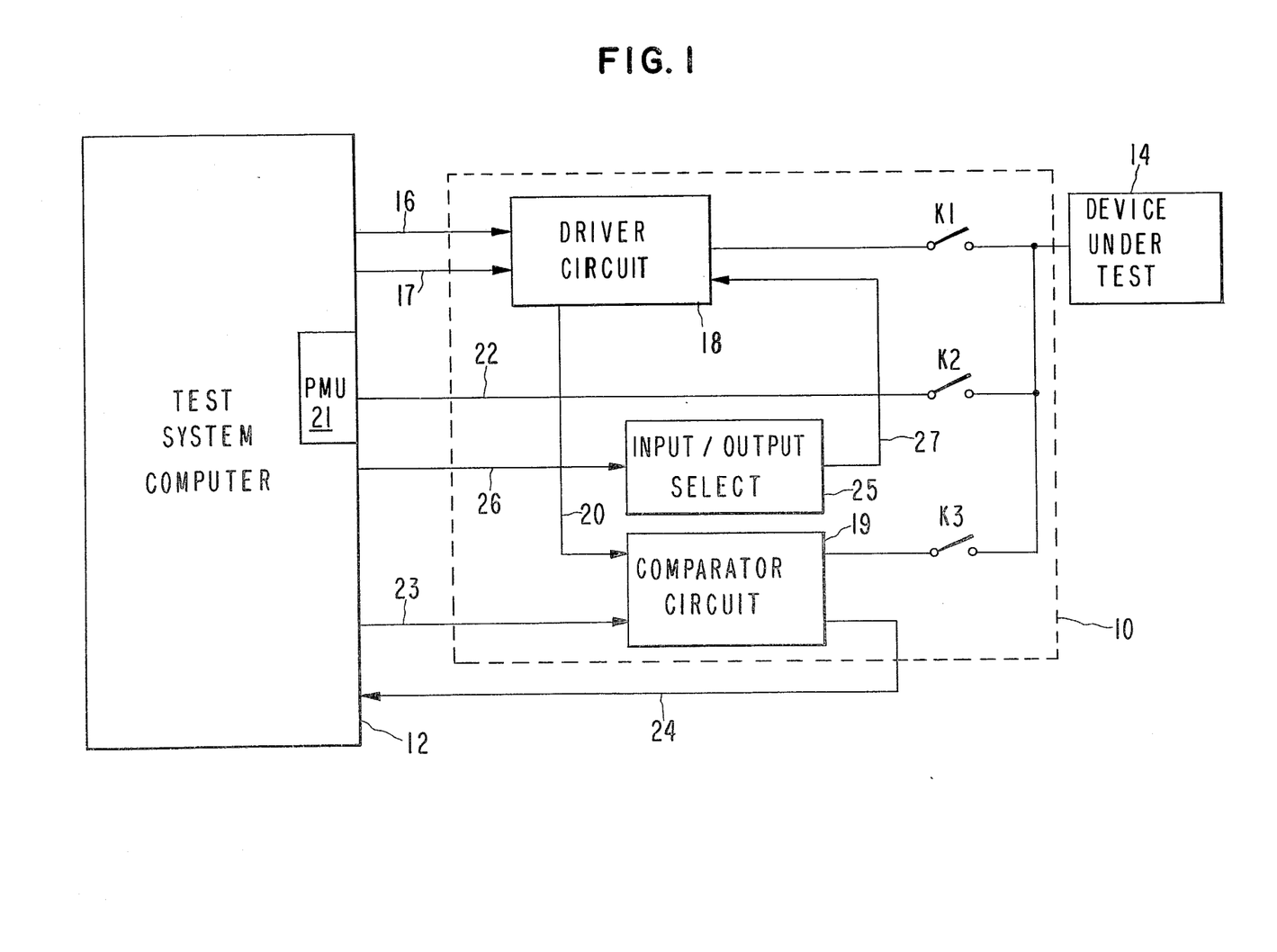
FIG. 1 is an overall block diagram of a circuit testing system including the testing circuit of the present invention.

Referring now to FIG. 1, an overall block diagram of the testing circuit 10 of this invention is illustrated coupled to a test system computer 12 and a device under test (DUT) 14. The test system computer typically comprises an input media, input/output devices, an output media, a central processing unit, and a memory. A test system computer 12 which may be employed with the testing circuit of the present invention is the Fairchild SENTRY 600 as manufactured by Fairchild Systems Technology Division of the Assignee of the present invention; 1725 Technology Drive; San Jose, Calif. The test system computer 12 supplies a pattern of pulses to the testing circuit 10 by means of lines 16. First reference voltages are supplied to the circuit 10 from the computer 12 by means of lines 17. In particular, lines 16 and 17 are coupled to inputs of a driver circuit 18 in the testing circuit 10. An output of the driver circuit 18 is coupled to an input of a comparator circuit 19 by means of a line 20. The signal supplied on line 20 is a synchronization signal having a pattern identical to that of the pulses supplied on one of the lines 16 from computer 12.

The testing circuit 10 as illustrated in FIG. 1, is repeated for each pin of the DUT 14. That is, if the DUT has eight pins then there are eight circuits identical to circuit 10 employed between the DUT 14 and the computer 12. Only one such testing circuit 10 is illustrated in FIG. 1 to simplify the drawings.

The output of the driver circuit 18 is coupled to the operating terminal of a relay K1, and the normally open contact of the relay K1 is coupled to a pin of the DUT 14.

A stored program in the test system computer 12 contains a set of instructions specifically written to test the DUT 14. Functional tests are performed by forcing input conditions on the input pins of the DUT, and comparing the actual results against the expected results at output pins of the DUT 14, by means of individual testing circuits 10 for each pin of the DUT. These input and output states for the device under test are stored in a local memory in the test system computer 12. The sequence of the test, the actual test, and the expected results for the test are also all stored in a program contained within the computer 12. The complete set of instructions and statements comprising the program is stored in the computer storage, and, as needed, on a peripheral storage medium such as a disk storage.

The circuit test system is also capable of performing parametric tests on the DUT. A parametric (or DC) test allows a voltage or current to be measured on any output pin of the DUT while forcing a voltage or current on an input pin. This type of testing is performed by a precision measurement unit (PMU) 21 located within the test system computer 12. Parametric testing is essential for defining minimum parameters for semiconductor devices (as well as other types of circuits) such as saturation voltage, input leakage current, etc. The PMU forces a voltage or current on any pin of the DUT 14 by means of a line 22 and relay K2 contact points. The parametric testing capability can be used in conjunction with functional testing to force a pin of the DUT to a required voltage level for functional testing.

The computer program for the test system computer 12 provides an analog to digital conversion for data logging of tests performed by the PMU 21. The PMU is coupled to the operating terminal of a relay K2 within the testing circuit 10 by means of a line 22. The normally open contact of the relay K2 is coupled to a pin of the DUT 14. The ouput of the comparator circuit 19 is coupled to the operating terminal of a relay K3, and the normally open contact of the relay K3 is coupled to a pin of the DUT 14.

The test system computer 12 supplies a second reference voltage used for comparison operations of the testing circuit 10 by means of a line 23. Line 23 is coupled to an input of the comparator circuit 19. The second output of the comparator circuit 19 is coupled to an input of the test system computer 12 by means of a line 24, which output is indicative of a pass or fail test of the particular pin of the DUT 14.

An input/output select circuit 25 is provided in the testing circuit 10 switch the output of the driver circuit 18 ON and OFF when the individual pin coupled to the testing circuit is functioning as both an input and output pin during a given test. The circuit 25 is controlled by signals supplied from the test system computer 12 by means of lines 26. The output signal from the circuit 25 is supplied to the driver circuit 18 by means of line 27.

Functional testing of a DUT 14 is performed by the test system illustrated in FIG. 1 by forcing voltage states representing logical ones and logical zeros at a frequency determined by the pulses supplied on lines 16 on all input pins of the DUT, and monitoring the resultant conditions of the output pins in a pass-fail mode by means of the comparator circuit 19. The signals are forced onto the input pins of the DUT 14 as a parallel pattern of logical ones and zeros, and the resulting output pattern is checked by the comparator circuit 19 in each of the testing circuits 10 coupled to each of the output pins of the DUT 14 in parallel. That is, in functional testing, all of the input pins of the DUT 14 are driven in parallel, and all of the output pins of the DUT are monitored in parallel after a programmed time interval. This functional testing capability is equivalent to a manual "truth table" type testing, but with greatly increased speed.

The test circuit 10 functions as a computer-controlled interface circuit between the test system computer 12 and the DUT 14. That is, the testing circuit 10 receives reference voltages on line 22 and digital data from circuits in the test system computer 12 and, through the driver circuit 18 and associated switches therein, the reference voltages are switched to the particular pin of the DUT 14 in accordance with the digital data programmed in the test system computer 12. The testing circuit 10 also receives reference voltages on the line 23 which comparator circuit 19 employs for comparison with the voltages from the DUT 14 output pins. The output signal from the comparator circuit 19 on the line 24 is returned to the test system computer 12 where each output pattern is checked for the proper response to the input pattern.

Each pin of the testing circuit 10 is universal in the sense that it can perform a range of functions under control of the computer program. Simply by inserting proper program instructions into the test system computer 12, the same pin can drive a DUT input pin, sense a DUT output pin, or supply a voltage to a power supply pin of the DUT. In addition, the testing circuit 10 can also provide a low resistance path to a pin of the DUT for parametric measurements by the PMU 21.

In patent application Ser. No. 518,134 filed Oct. 25, 1974, by R. Huston entitled: "Structure and Method for Testing Microprocessor Central Processing Units"; an organization of a test system computer and a testing circuit similar to that of this invention is disclosed, and an application of the use of a testing circuit 10 is described.

Figure 2:
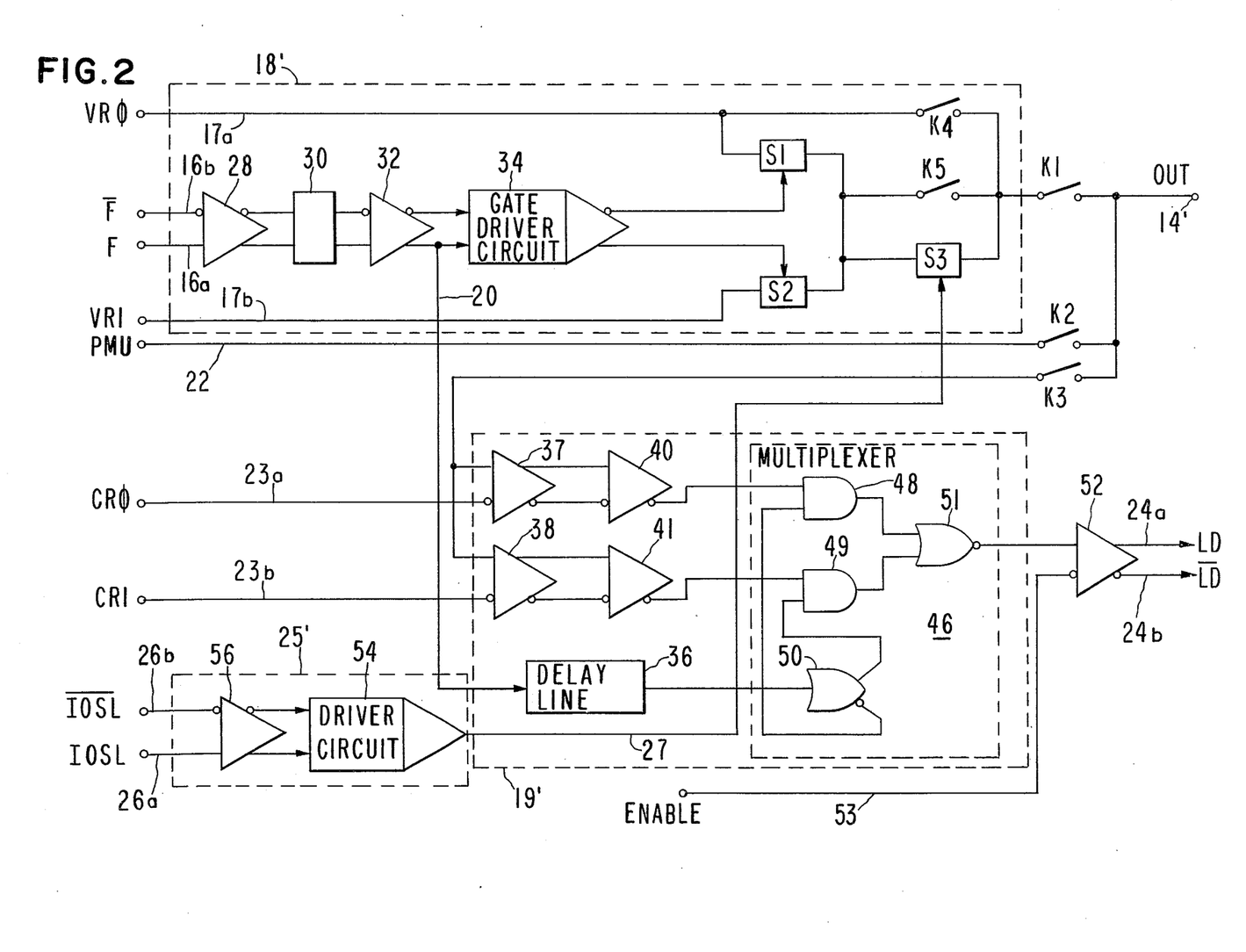
FIG. 2 is a detailed block diagram of the testing circuit of this invention.

Referring now to FIG. 2, a more detailed block diagrm of the testing circuit 10 of the present invention is illustrated; the portion of the diagram illustrated in FIG. 2 enclosed within line 18' comprises the driver circuit 18; the portion of the diagram enclosed within the dashed line 19' comprises the comparator circuit 19; and, the portion of the diagram enclosed within the dashed line 25' comprises the input/output select circuit 25.

Line 16a from the test system computer 12 is coupled to the non-inverting input of an amplifier 28, and the line 16b is coupled to the inverting input of the amplifier 28. The pulse signal supplied on the line 16a is also referred to herein as the F data signal, and the signal supplied on the line 16b is also referred to as the F data signal. The inverted and non-inverted outputs of the amplifier 28 are coupled to two inputs of a skew adjustment circuit 30. The outputs of the skew adjustment circuit 30 are coupled to the inverting and non-inverting inputs, respectively, of an amplifier 32. The skew adjustment circuit 30, which comprises an RC network, is used to adjust the signal skew difference (maximum of 1 nanoseconds) between the output signal from one testing circuit 10 and the output signal from other testing circuits (identical to circuit 10) also coupled between the test system computer 12 and the DUT 14 for the remaining pins of the DUT 14.

The inverted output of the amplifier 32 is coupled to one of two inputs of a gate driver circuit 34. The non-inverted output of the amplifier 32 is coupled to the second input of the gate driver circuit 34, and to the input of a delay line 36 by means of the line 20. The inverted output of the gate driver circuit 34 is coupled to the switching input of a switch S1, and the non-inverted output of the gate driver circuit 34 is coupled to the switching input of a switch S2. Switches S1 and S2 typically comprise field effect transistors (FET).

A first reference voltage, identified herein as VRO, is supplied by the test system computer 12 on line 17a to one terminal of the switch S1 and to the operating terminal of a relay K4. A second reference voltage, identified herein as VR1, is supplied on line 17b from the test system computer 12 to one terminal of the switch S2. The second terminals of the switches S1 and S2 are connected together, and this connection is coupled to the operating terminal of a relay K5, and to one side of a switch S3. the switch S3 may also comprise an FET. The second terminal of the switch S3 and the normally open contacts of the relays K4 and K5 are connected together and this connection is coupled to the operating terminal of the relay K1. The normally open contact of the relay K1 is connected to a pin 14' of the DUT 14.

Lines 23a and 23b, which constitute the lines 23 from the test system computer 12 (FIG. 1), are coupled to the inverting inputs of two FET buffer amplifiers 37 and 38, respectively. The signals supplied on lines 23a and 23b are referred to herein as CR0 and CR1, respectively. CR0 is normally a low-level threshold comparator reference voltage, and CR1 is normally a high-level threshold comparator reference voltage. However, CR0 can be a high-level voltage and CR1 can be a low-level voltage in accordance with program instructions in the test system computer 12. The two FET buffer amplifiers 37 and 38 are designed with a high common-mode rejection, a low offset, and a high input impedance to minimize loading of the DUT 14 during comparison operations. The non-inverting inputs of the amplifiers 37 and 38 are both coupled to the operating terminal of the relay K3. The inverted and non-inverted outputs of the amplifier 37 are coupled, respectively, to the inverting and non-inverting inputs of a comparator 40; and, the inverted and non-inverted outputs of the amplifier 38 are coupled, respectively, to the inverting and non-inverting inputs of a comparator 41. The inverted outputs of the comparators 40 and 41, and the output of the delay line 36 are coupled to inputs of a multiplexer circuit 46.

The multiplexer circuit 46 comprises logic gates for switching the outputs of the comparators 40 and 41 as a function of the F data pulses to the line 24. In particular, the inverted output of the comparator 40 is coupled to the first of two inputs of an AND gate 48, and the inverted output of the comparator 41 is coupled to the first of two inputs of an AND gate 49. The output of the delay line 36 is coupled to a single input of an OR gate 50. The non-inverted output of the OR gate 50 is coupled to the second input of the AND gate 49, and the inverted output of the OR gate 50 is coupled to the second input of the AND gate 48. The output of the AND gates 48 and 49 are coupled, respectively, to the two inputs of a NOR gate 51. The output of the NOR gate 51 is coupled to the non-inverting input of a line driver amplifier 52. The inverting input of the line driver 52 is coupled to an Enable signal line 53. The Enable signal is employed for time multiplexing more than one testing station. The inverted and non-inverted outputs of the line driver amplifier 52 are supplied on lines 24a and 24b, respectively, to the test system computer 12. The multiplexer circuit 46 may comprise, for example, a Fairchild device type 9580 as manufactured by the Assignee of this invention.

An individual pin of the DUT 14 can be at one of three states. A first state is that the pin can be an input pin only; the second state is that the pin can be an output pin only; and, the third state is that the pin can be either an input or an output pin during a given test. These states are controlled by the relays K1 and K3 and the switch S3. Switch S3 is switched by the input/output select circuit 25 to switch the pin 14' from an input pin to an output pin or vice versa during a given test. The driver circuit 54 is controlled by signals from the test system computer 12 supplied on lines 26a and 26b, which signals are designated herein as IOSL and IOSL (input/output select). Lines 26a and 26b are coupled respectively to the non-inverting and inverting inputs of an amplifier 56, and the inverted and non-inverted outputs of the amplifier 56 are coupled to inputs of the driver circuit 54. When the pin 14' is to be an output pin only, relay K3 is closed and relay K1 is open. When the pin 14' is to be an input pin only, the relays K1 and K5 are both closed and the switch S3 is ON for the clock mode of operation, and relay K1 is closed and the switch S3 is ON for the date mode of operation. And, when the pin 14' is to be an input or output pin during a given test, relays K1 and K3 are both closed, relay K5 is open, and switch S3 is switched ON and OFF as a function of the IOSL and IOSL signals.

The driver circuit 18 operates like a single-pole double-throw switch. Field effect transistors (switches S1 and S2) are employed for switching between the two reference voltage levels VR1 and VR0 supplied on line 17b and 17a, respectively. Hence, dual gate drivers, operating at 180° out of phase, are used in the gate driver circuit 34 for switching the FET's (switches S1 and S2) so that for any transition time one switch is turning on while the other switch is turning off. The driver circuit 18 typically comprises a line receiver amplifier 28 having two inputs coupled to the lines 16a and 16b, which lines transmit the F data signals. Also, the driver circuit 18 includes a gate driver circuit disposed for translating the F data from the line receiver amplifier 28 to voltage levels necessary for turning the appropriate FET switches S1 and S2 ON or OFF. A tracking circuit, as will be further described hereinbelow, is incorporated within the gate driver circuit 34 to mitigate the switching voltage level swings, and thereby eliminate glitches which can occur during the transition time (switching time) from one voltage level to another.

The gate driver 18 must be capable of interfacing with ECL logic levels; and, it must be capable of providing a drive voltage at least as high as the highest reference voltage to be programmed, and at least as low as one pinch-off voltage level below the lowest reference voltage to be programmed. The FET switches S1 and S2 are selected for low resistance and capacitance characteristics. In one embodiment S1 and S2 each comprise three FETs coupled in parallel as will be described further hereinbelow.

In operation, F data is supplied to the testing circuit 10 by means of the lines 16a and 16b in the form of pulses at a frequency of 10 megahertz, or any other desired frequency up to 10 megahertz. These pulses are amplified by amplifiers 28 and 32 and by an amplifier (not shown) in the gate driver circuit 34. The inverted and non-inverted outputs of the amplifier in the gate driver circuit 34 are 180° out of phase and are at the same frequency of the F data supplied on the lines 16a and 16b. Accordingly, switches S1 and S2 are operated 180° out of phase at the frequency of the F data oscillatory signal. The voltage levels supplied on the lines 17a and 17b (voltage levels VR0 and VR1, respectively) are determined by the test system computer program in accordance with voltage levels compatible with the DUT 14.

Assuming, for example, that the pin 14' of the DUT 14 is an input pin only, then relays K1 and K5 are closed and switch S3 is ON, for the clock mode of operation, and relay K1 is closed and the switch S3 is ON for the data mode of operation. Therefore, the signal appearing at pin 14' is oscillating at a frequency equal to that of the F data and varying between voltage levels equal to VR0 and VR1. This signal could, for example, comprise a clock signal supplied to the DUT 14. However, if the signal to be supplied to the DUT is a power supply voltage, then relays K1 and K4 are closed, and relay K5 is open and switch S3 is OFF. Hence, the voltage level supplied to the pin 14' is equal to the value of the voltage set for VR0 on line 17a.

If, for example, the pin 14' of the DUT 14 is an output pin only then relays K1, K4 and K5 are open and relay K3 is closed. The signal supplied on the output pin 14' from the DUT (in this example) is supplied to the non-inverting inputs of the FET buffer amplifiers 37 and 38 by means of the closed relay contact K3. The voltage level supplied on the lines 23a and 23b (voltage levels CR0 and CR1) are supplied to amplifiers 37 and 38 in addition to the output signal from the pin 14' to the respective inputs of the comparators 40 and 41. Normally, the signal supplied on the line 23a establishes a low-level voltage threshold for comparison purposes, and the voltage level supplied on the line 23b establishes an upperlevel threshold voltage for comparison purposes. If the signal supplied on the pin 14' is an oscillatory signal at the frequency of the F data, then the results of the comparators 40 and 41 are switched by means of the multiplexer 46 at a frequency equal to that of the F data. The output of the multiplexer circuit 46 and the output of the NOR gate 51 in particular, provides a positive logic high level when the signal level supplied at the input of the comparator is greater than that of the reference level. However, an inversion of this signal is required when the voltage level to be detected in a less-than-reference-voltage level condition. This conversion is performed in the test system computer 12 under program control. The output of the multiplexer circuit 46 is supplied to the test system computer 12 by means of the lines 24a and 24b when the Enable signal is at a level midway between the high and low levels that gate 51 can provide (typically about −1.3 volts).

The comparator circuit 22 comprises two FET buffer amplifiers 37 and 38 having a high input impedance to the device under test 14 to minimize loading and a high common-mode rejection with a low off-set. The buffer amplifiers 37 and 38 translate the input voltage comparisons to a low common mode that is acceptable to the inputs of the comparators 40 and 41. Comparators 40 and 41 also have a high input impedance to minimize loading. The multiplexer circuit 46 is coupled to the output of the comparators 40 and 41 for switching between the two comparator outputs. A line driver amplifier 52 is coupled between the output of the multiplexer circuit 46 and the line 24. The two comparators are employed in the comparator circuit 19 to improve voltage-level comparisons of high frequency signals, and the outputs thereof are switched as a function of the F data supplied on the lines 16a and 16b for synchronization of the comparison operation with the frequency of the input/clock signals to the DUT 14.

The gain of the buffer amplifiers is nominally at one to minimize effective input capacitance. The comparators accept the translated comparison signals from the buffer amplifiers and translate the signals to an ECL Logic level output compatible with the logic circuitry of the multiplexer 46. The combination of the buffer amplifiers 37 and 38 and the comparators 40 and 41 is fast (having a propagation delay typically of 5 nanoseconds), accurate in operation (having a hysteresis of ±5 millivolts) and having a low off-set (typically less than 5 millivolts). The comparators 40 and 41 employed in one embodiment of this invention typically comprise circuit types A58634 as manufactured by Advanced Micro Devices of Sunnyvale, Calif., which devices are sold under the name of Voltage Comparators.

The use of the two comparators and the multiplexer circuit in combination allows smoother transition between comparisons of two discretely different voltage levels, since both comparators are continually operating and switching occurs at the outputs thereof by the multiplexer circuit 46. Also, the use of two comparators eliminates glitches which may occur at the switching time interval.

Figure 3:
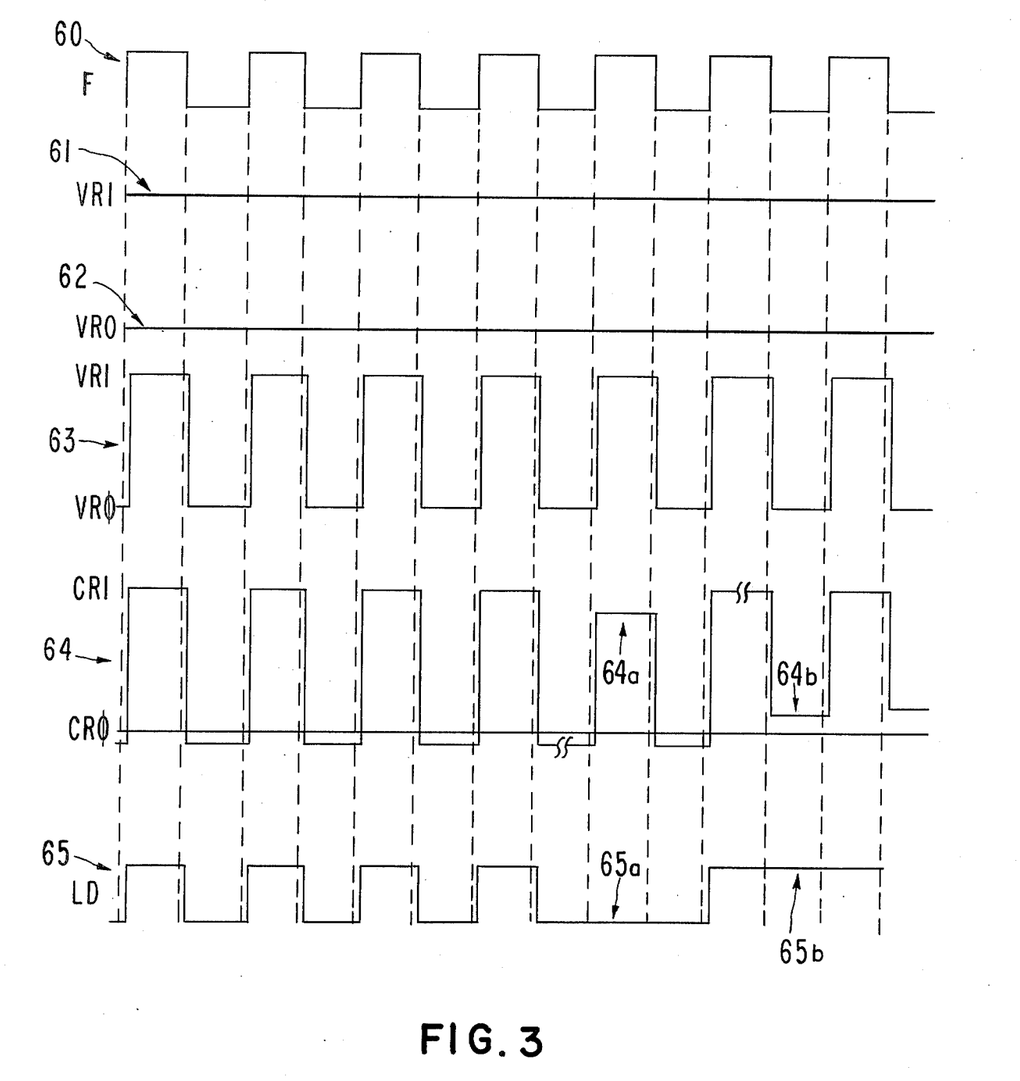
FIG. 3 is a timing diagram illustrating the operation of the testing circuit.

To aid in a better understanding of the operation of the circuit of FIG. 2, reference is made to the timing diagram illustrated in FIG. 3. Waveform 60 represents the pulse signals (F data) supplied on the line 16a from the test system computer 12 to the testing circuit 10. The complementary pulses ($\overline{F}$ data) supplied on the line 16b are 180° out of phase with the signal represented by waveform 60. Waveform 61 represents the DC voltage level supplied on the line 17b, and referred to herein as VR1; and, waveform 62 represents the DC voltage level supplied on the line 17a, and referred to herein as VR0. The DC value for VR1 and VR0 may be set at values independent of one another. That is, VR1 may be set for a "logic one" (1) level for ECL, TTL, or MOS type circuitry; and, VR0 may be set to represent a "logic zero" (0) level for similar type circuitry. However, VR0 may be set for a "logic zero" (0) state and VR1 may be set for a "logic one" (1) state. The frequency of the F data (waveform 60) may be set at any level up to 10 megahertz under control of the test system computer 12, and the pattern of pulses may comprise any format in accordance with the data stored in the local memory in the test system computer 12.

Switches S1 and S2 are switched at a frequency equal to that of the F data, and the VR0 and VR1 voltage levels are supplied through switches S1 and S2, whereby the signal appearing at the normally open contact of the relay K5 constitutes that as represented by waveform 63 in FIG. 3. That is, the signal appearing at relay K5 (waveform 63) comprises a signal having a frequency equal to the F data, having a positive-peak amplitude equal to the VR1 voltage level (or VR0 if reversed), and a negative-peak amplitude equal to the VR0 voltage level (or VR1 if reversed). Note that there is a time delay between the rise times of the waveform 63 and the rise times of the waveform 60. This time delay is due to circuitry time delay between the input of the gate driver circuit 34 and the normally open contact of the relay K5.

Assume, for example, that the pin 14' is an output pin of the DUT 14 and that the relay K3 is closed. Assume further that the waveform for the signal supplied from the DUT 14 output pin is depicted by a waveform 64 in FIG. 3, then the signal supplied at the output of the line driver amplifier 52 is represented by a waveform 65. Note that there is also a time delay between the rise time of the waveform 64 and the rise time of the waveform 60. This time delay is intentionally provided by the time delay 36 to compensate at the multiplexer circuit 46 for the time delay as illustrated by waveform 63 and discussed above. When the positive and negative levels of the waveform 64 are equal to or exceed the reference levels CR1 and CR0 the output of the line driver amplifier 52 indicates a pass test condition. However, when the positive portion of the waveform 64, as indicated by portion 64a of waveform 64 does not meet the minimum level for a pass test, then a fail test condition is indicated by portion 65a of waveform 65. Also, at portion 64b of waveform 64 the negative voltage level of the waveform 64 does not meet the minimum threshold voltage level of reference voltage CR0 and a fail test indication is provided at the output of the line driver 52 as indicated by portion 65b of waveform 65. The test system computer 12 compares the waveform 65 from the line driver circuit 52 with a programmed expected signal pattern. At portions 65a and 65b of waveform 65 a fail-test error is indicated or recorded.

Figure 4:
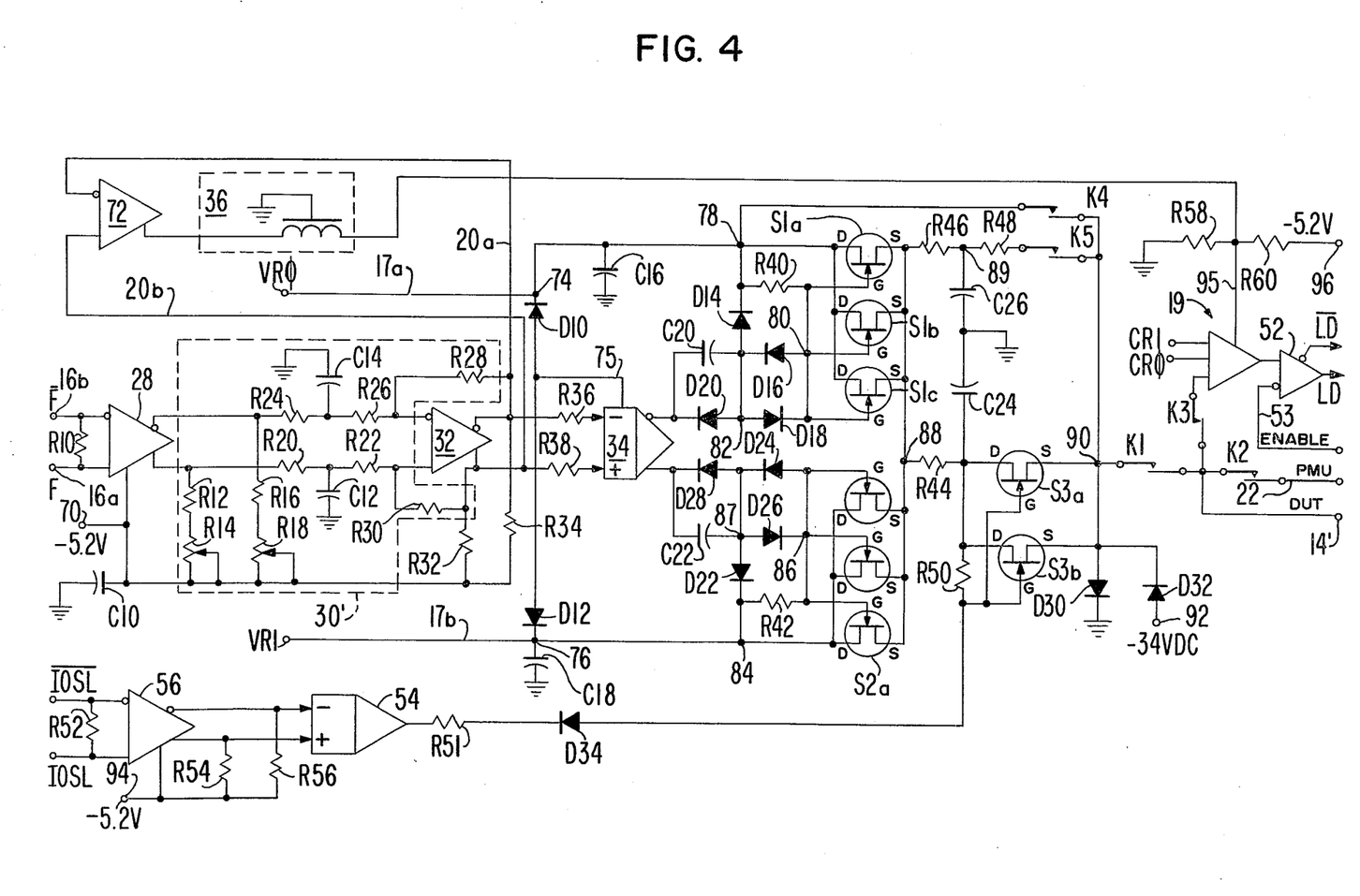
FIG. 4 is a schematic diagram of the testing circuit.

Referring now to FIG. 4, a detailed schematic diagram of the testing circuit 10 is illustrated. A resistor R10 is coupled between the lines 16a and 16b, which lines are coupled to the non-inverting and inverting inputs, respectively, of the amplifier 28. The voltage supply for the amplifier 28 is coupled to a terminal 70, which terminal is coupled to a −5.2 volt power supply. A capacitor C10 is coupled between the terminal 70 and ground potential.

The portion of the circuit enclosed within dashed line 30' comprises the skew adjustment circuit 30. This circuit permits independent adjustment of the leading and trailing edge delay of F data as it propagates from the input (lines 16a and 16b) to the DUT line 14'. In particular, a resistor R12 and a variable resistor R14 are coupled in series between the non-inverting output of the amplifier 28 and the terminal 70. A resistor R16 and a variable resistor R18 are coupled in series between the inverted output of the amplifier 28 and the terminal 70. Resistor R14 is varied to advance or delay the leading edge of the F data, and resistor R18 is varied to advance or delay the trailing edge of the F data.

Resistors R20 and R22 are coupled in series between the non-inverted output of the amplifier 28 and the non-inverting input of the amplifier 32. A capacitor C12 is coupled between the junction between the resistors R20 and R22 and ground potential. Resistors R24 and R26 are coupled in series between the inverted output of the amplifier 28 and the inverting input of the amplifier 32. A capacitor C14 is coupled between the connection between the resistors R24 and R26 and ground potential. Capacitors C12 and C14 comprise the reactive elements of the skew adjustment circuit 30, and thereby aid in effecting an advance or delay of the F data. A feedback resistor R28 is coupled between the inverting input of the amplifier 32 and the inverted output thereof. Also, a resistor R32 is coupled between the non-inverted output of the amplifier 32 and the terminal 70, and resistor R34 is coupled between the inverted output of the amplifier 32 and the terminal 70. The inverted output of the amplifier 32 is coupled to the inverting input of the gate driver circuit 34 through a resistor R36, and is coupled to line 20a, which line is connected to the inverting input of an amplifier 72. The non-inverted output of the amplifier 32 is coupled to the non-inverting input of the gate driver circuit 34 through a resistor R38, and is coupled to the non-inverting input of the amplifier 72 by means of line 20b.

The line 17a, which transmits the VR0 reference voltage level, is coupled to the cathode of a diode D10 at a circuit point 74. The anode of the diode D10 is coupled to a reference voltage input of the gate driver circuit 34 by means of a line 75, and to the anode of a diode D12. The cathode of the diode D12 is coupled to the line 17b, which transmits the VR1 reference voltage level, at a circuit point 76. Diodes D10 and D12 comprise a part of the tracking circuit within the gate driver circuit 34, which will be explained further hereafter. A capacitor C16 is coupled between the circuit point 74 and ground potential, and a capacitor C18 is coupled between the circuit point 76 and ground potential.

The circuit point 74 is also coupled to the drain terminal of a FET S1a of the switch S1, to the cathode of a diode D14, to one terminal of a resistor R40, and to the normally open contact of the relay K4 at circuit point 78. Also, the drain terminals of FETs S1b and S1c are coupled to the drain terminal of the FET S1a and to the circuit point 78. The second terminal of the resistor R40 is coupled to the gate terminals of the FET's S1a, S1b, and S1c at a circuit point 80. Circuit point 80 is also coupled to the anode of a diode D16 and to the cathode of a diode D18. The anode of the diode D14, the cathode of the diode D16, and the anode of the diode D18 are all coupled together at a circuit point 82, which is also coupled to the anode of a diode D20. A capacitor C20 is coupled between the circuit point 82 and the inverted output of the gate driver circuit 34. The cathode of the diode D20 is also coupled to the inverted output of the gate driver circuit 34.

The circuit point 76, which is coupled to the line 17b, is also coupled to the drain terminal of a FET S2a, one terminal of a resistor R42, and to the cathode of a diode D22 at a circuit point 84. The drain terminals of FETs S2b and S2c are also coupled to the drain terminal of the FET S2a, and to the circuit 84. The second terminal of the resistor R42 is coupled to the gate terminals of the FETs S2a, S2b and S2c at a circuit point 86. The circuit point 86 is also coupled to the anode of a diode D24, and to the cathode of a diode D26. The cathode of the diode D24, the anode of the diode D26, and the anode of the diode D22 are all coupled together at a circuit point 87, which circuit point is also coupled to the anode of a diode D28. A capacitor C22 is coupled between the non-inverted output of the gate driver circuit 34 and the circuit point 87. The source terminals of the FETs S1a, S1b, S1c, S2a, S2b, and S2c are all coupled together at a circuit point 88. The circuit point 88 is coupled to the drain terminals of FETs S3a and S3b through a resistor R44. A capacitor C24 is coupled between the drain terminals of the FETs S3a and S3b and ground potential.

The source terminal of FET S1a is coupled to one side of a resistor R46, and the second side of the resistor R46 is coupled to a circuit point 89. A capacitor C26 is coupled between circuit point 89 and ground potential, and a resistor R48 is coupled between the circuit point 89 and the normally open contact of the relay K5. The operating terminals of the relays K4 and K5 are coupled together at a circuit point 90. Circuit point 90 is also coupled to the source terminals of the FETs S3a and S3b, to the normally open contact of the relay K1, to the anode of a diode D30, and to the cathode of a diode D32. The cathode of the diode D30 is coupled to ground potential, and the anode of the diode D32 is coupled to a −34 volt power supply on a terminal 92.

The drain terminal of the FET S3b is coupled to the gate terminal thereof by means of a resistor R50. The gate terminals of the FETs S3a and S3b are coupled to the anode of a diode D34, by means of the line 27, and the cathode of the diode D34 is coupled to the output of the driver circuit 54 through a resistor R51. The inverting and non-inverting inputs of the circuit 54 are coupled, respectively, to the inverted and non-inverted outputs of the line driver circuit 56. A resistor R52 is coupled between the inverting and non-inverting inputs of the amplifier 56, which inputs are coupled, respectively, to the lines 25 and 25a. The supply voltage for the amplifier 56 is supplied on a terminal 94, which is coupled to a −5.2 volt power supply. A resistor R54 is coupled between the non-inverted output of amplifier 56 and the terminal 94; and, a resistor R56 is coupled between the inverted output of the amplifier 56 and the terminal 94. The resistors R54 and R56 are employed as pull-down resistors to speed up the output of the line driver amplifier 56.

The output of the amplifier 72 is coupled through delay line 36 (an inductive coil) to a reference input of the comparator circuit 19 by means of a line 95. Also, a resistor R58 is coupled between the line 95 and ground potential, and a second resistor R60 is coupled between the line 95 and a −5.2 volt power supply on a terminal 96. The line driver amplifier 52, with the accompanying Enable signal input on line 53, is coupled to the output of the comparator multiplexer which is the same as that described hereinabove.

The line 22 from the PMU 21 (FIG. 1) is coupled to the operating terminal of the relay K2. The normally open contact of relay K2 is connected to the operating terminal of the relay K1 and to the operating terminal of the relay K3. This connection is also coupled to the device under test pin 14'.

Figure 5:
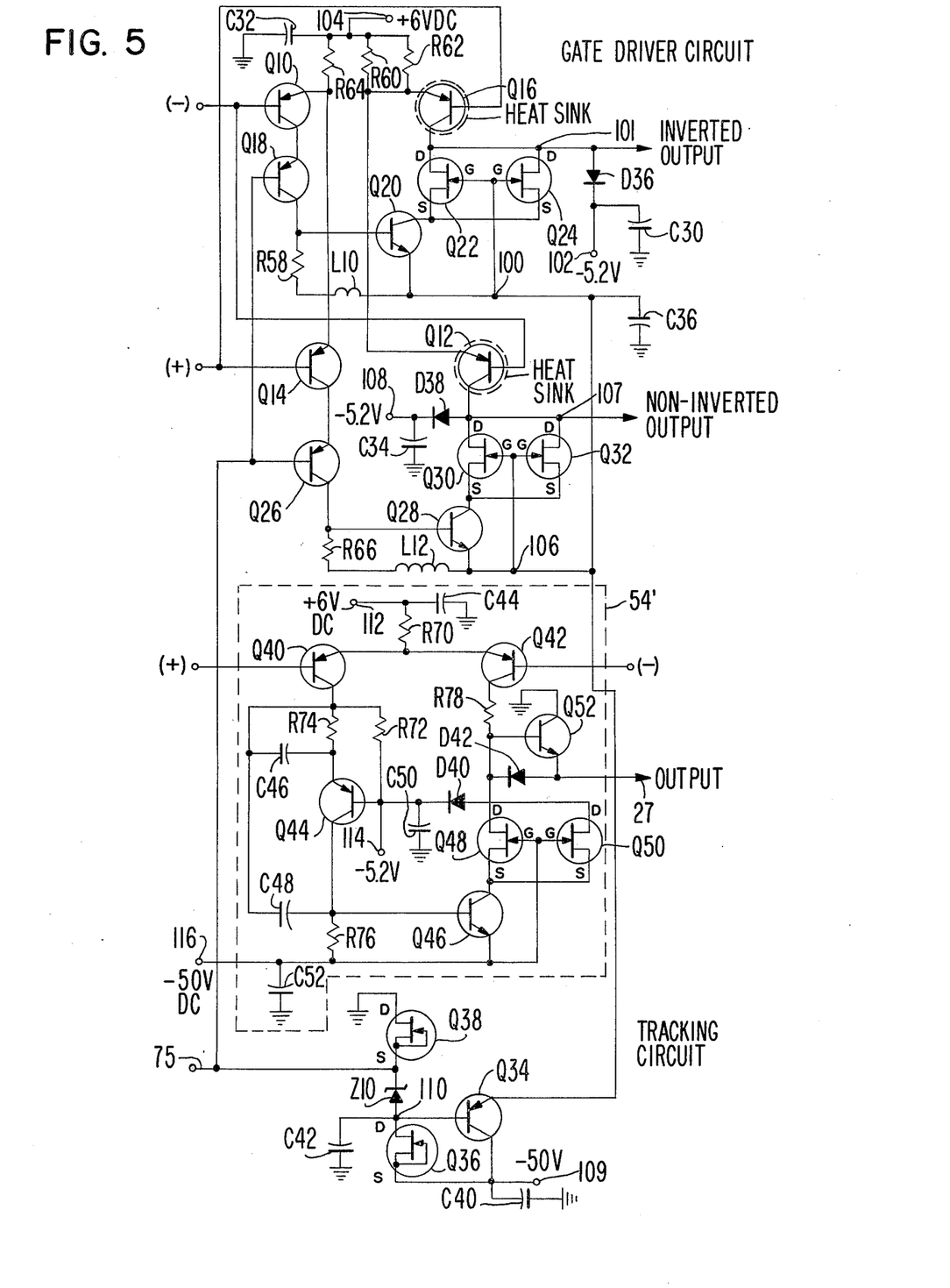
FIG. 5 is a detailed schematic diagram of the gate driver circuit and tracking employed in the testing circuit of this invention.

Referring now to FIG. 5, a schematic diagram of the gate driver circuit 34, and the driver circuit 54 and the tracking circuit are illustrated in greater detail. The portion of the schematic diagram enclosed within the dashed line 54' comprises the driver circuit 54, and the portion of the schematic diagram enclosed within the dashed line 99 comprises the tracking circuit; whereas the remaining portions of the schematic diagram of FIG. 5 represent the gate driver circuit 34. The inverting (−) input of the gate driver circuit 34 is coupled to the base terminals of a transistor Q10, and to the base terminal of a transistor Q12.

The non-inverting (+) input of the gate driver circuit 34 is coupled to the base terminals of transistors Q14 and Q16. Since transistors Q12 and Q16 dissipate a large amount of heat, each of these transistors is located in a heat sink, as indicated by the dashed circles in the drawing. The collector terminal of the transistor Q10 is connected to the emitter terminal of a transistor Q18. The collector terminal of the transistor Q18 is coupled to the base terminal of a transistor Q20, and to the first terminal of a resistor R58.

The second terminal of the resistor R58 is coupled to the emitter terminal of the transistor Q20 through an inductive coil L10. The collector terminal of the transistor Q20 is connected to the source terminals of FETs Q22 and Q24. The emitter terminal of the transistor Q20 is connected to the gate terminals of the FETs Q22 and Q24 at a circuit point 100. The drain terminals of the FETs Q22 and Q24 are connected together at a circuit point 101, and this connection is coupled to the collector terminal of transistor Q16, to the inverted output of the gate driver circuit 34, and to the anode of a diode D36. A capacitor C30 is coupled between the cathode of the diode D36 and ground potential. The cathode of diode D36 is also coupled to a −5.2 volt power supply on a terminal 102.

The emitter terminals of the transistors Q12 and Q16 are connected together and this connection is coupled to a +6 volt power supply on a terminal 104 through two parallel resistors R60 and R62. The emitter terminal of the transistor Q10 is coupled to the emitter terminal of the transistor Q14, and through a resistor R64 to the terminal 104. A capacitor C32 is coupled between the terminal 104 and ground potential. In one embodiment the values for resistors R60, R62, and R64, and capacitor C32 are as follows:

R60 — 150 ohms, ½ watt, at 2% tolerance;
R62 — same as R60;
R64 — 620 ohms, ¼ watt, at 5% tolerance;
C32 — 0.2 microfarads at 50 volts or comprising two capacitors in parallel at 0.1 microfarads each.

The collector terminal of the transistor Q14 is connected to the emitter terminal of a transistor Q26. The collector terminal of the transistor Q26 is connected to the base terminal of a transistor Q28. The base terminal of the transistor Q28 is coupled to the emitter terminal thereof through a series connection of a resistor R66 and an inductive coil L12. The collector terminal of the transistor Q28 is coupled to the source terminals of FETs Q30 and Q32. The emitter terminal of the transistor Q28 is coupled to the gate terminals of the FETs Q30 and Q32 at a circuit point 106. The drain terminals of the FETs Q30 and Q32 are connected together at a circuit point 107 and this connection is coupled to the collector terminal of the transistor Q12, the non-inverted output of the gate driver circuit 34, and to the anode of a diode D38. The cathode of the diode D38 is coupled to a −5.2 volt power supply on a terminal 108. A capacitor C34 is coupled between the terminal 108 and ground potential.

A capacitor C36 is coupled between the circuit point 100 and ground potential. Also, circuit point 100 is coupled to the emitter terminal of a transistor Q34 in the tracking circuit. The collector terminal of the transistor Q34 is coupled to a −50 volt power supply on a terminal 109, and to the source terminal of a current source FET Q36. A capacitor C40 is coupled between terminal 109 and ground potential. The source terminal of the FET Q36 is coupled to the gate terminal thereof, thereby forming a constant current source. The drain terminal of the FET Q36 is coupled to the base terminal of the transistor Q34, and to the anode of a zener diode D10 at a circuit point 110. A capacitor C42 is coupled between the circuit point 110 and ground potential. The cathode of the zener diode Z10 is coupled to the source and gate terminals of an FET Q38 (which forms a constant current source), to the base terminal of the transistor Q26, to the base terminal of the transistor Q18, and to the reference input on the line 75. The drain terminal of the FET Q38 is coupled to ground potential.

The function of the tracking circuit is to mitigate the peak-to-peak amplitude of the switching signal at the output of the gate driver circuit 34, while testing with low voltage levels for VRO and VR1, and thereby substantially eliminate undesired glitches in the testing circuit 10 output signal. In one example testing circuits without such a tracking circuit, the switching signal appearing at the output of circuit 34 has a peak-to-peak amplitude of 45 volts, with amplitude swings from −5 volts to −50 volts. There is a brief time delay between the switching from one voltage level (e.g., a first amplitude of −5 volts) to another voltage level (e.g., a second amplitude of −50 volts). During this time delay both switches S1 and S2 (FIGS. 2 and 4) are turned OFF. Hence, glitches appear during this time delay in the output signal appearing at pin 14' of the DUT 14 as a result of capacitive coupling from the gate to source terminals of switches S1 and S2. The glitches create a problem when testing a high speeds of operation.

The combination of the two constant current sources Q36 and Q38, with the zener diode Z10 coupled therebetween, and the diodes D10 and D12 (FIG. 4) coupled to the outputs of the circuit 34 operate to limit the peak-to-peak amplitude of the switching signal of the gate driver circuit. With the addition of the tracking circuit, the peak-to-peak amplitude of the switching signal is determined by the more negative reference voltage level as between VR0 and VR1. That is, the switching signal varies in amplitude from −5 volts to −10 volts lower than the most negative reference voltage level (VR0 or VR1). In one example where the more negative reference voltage level is −11 volts the peak-to-peak amplitude of the switching signal is 16 volts (−5 volts to −10 volts more negative than the −11 volt reference voltage level). Accordingly, the time delay between switching from a first amplitude to a second amplitude is reduced, and the glitches in the output signal of the testing circuit of this invention have been substantially eliminated. Thus, the tracking circuit improves the operation of the prior art testing circuit and allows for an increase in speed of operation while maintaining a clean output signal waveform (i.e., no glitches).

With reference to the driver circuit 54 enclosed within the dashed line 54', the non-inverting (+) input thereof is coupled to the base terminal of a transistor Q40. The emitter terminal of the transistor Q40 is connected to the emitter terminal of a transistor Q42, and this connection is coupled to a +6 volt power supply on a terminal 112 through a resistor R70. A capacitor C44 is coupled between terminal 112 and ground potential. The base terminal of the transistor Q42 is coupled to the inverting (−) input of the driver circuit 54. The collector terminal of the transistor Q40 is coupled to one side of a resistor R72, one side of a resistor R74, one side of a capacitor C46, and one side of a capacitor C48. The second side of the resistor R74 and the second side of the capacitor C46 are connected together and this connection is coupled to the emitter terminal of a transistor Q44. The second side of the resistor R72 is connected to the base terminal of the transistor Q44 and this connection is coupled to a −5.2 voltage supply on a terminal 114, to one side of a capacitor C50, and to the cathode of a diode D40.

The collector terminal of the transistor Q44 is coupled to the second side of the capacitor C48, to one side of a resistor R76, and to the base terminal of a transistor Q46. The second side of the resistor R76 is coupled to a −50 volt power supply on a terminal 116, to one side of a capacitor C52, to the emitter terminal of the transistor Q46, and to the gate terminals of FETs Q48 and Q50. The second side of capacitor C52 is coupled to ground potential. The collector terminal of transistor Q46 is coupled to the source terminals of FETs Q48 and Q50. The drain terminals of the FETs Q48 and Q50 are connected together, and this connection is coupled to the anode of the diode D40, to the cathode of a diode D42, to the base terminal of a transistor Q52, and to the collector terminal of the transistor Q42 through a resistor R78. The emitter terminal of the transistor Q52 is coupled to the anode of the diode D42, and to the output line 27 of the driver circuit 54. The collector terminal of the transistor Q52 is coupled to ground potential.

Figures 6, 7:
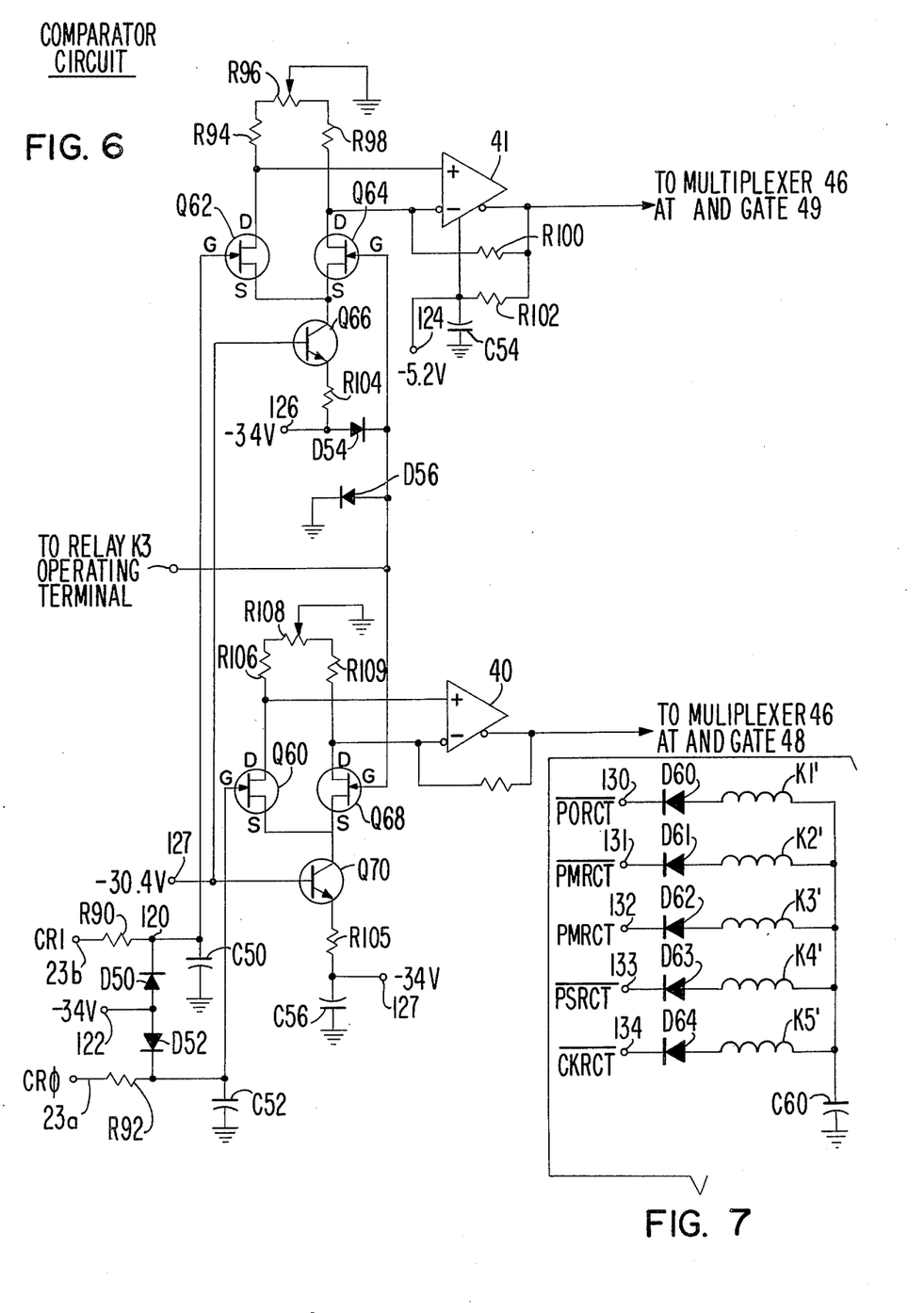

Referring now to FIG. 6, the comparator circuit 19 (excluding the multiplexer circuit 46 which was described hereinabove) is illustrated in schematic diagram form. The CR1 reference voltage level line 23b is coupled to a circuit point 120 through a resistor R90. Circuit point 120 is coupled to the cathode of a diode D50 and to one side of the capacitor C50. The anode of the diode D50 is coupled to the anode of coupled to one side of a resistor R94, and to the non-inverting input of the comparator 41. The second side of the resistor R94 is connected to a first terminal of a potentiometer R96. The drain terminal of the FET Q64 is coupled to one side of a resistor R98, and to the inverting input of the comparator 41. The second side of the resistor R98 is connected to the second terminal of the potentiometer R96. The wiper on the potentiometer R96 is coupled to ground potential. In one embodiment resistors R94 and R98 have a value of 100 ohms, and are ⅛ watt resistors with 1% tolerance. Also in one embodiment Q62 and Q64 are fabricated on the same semiconductor chip to match device characteristics.

The inverting input to the comparator 41 is coupled to one side of a resistor R100. The second side of the resistor R100 is coupled to the inverted output of the comparator 41, to the comparator 19 output which is connected to the multiplexer 46 at AND gate 49 thereof, and to one side of a resistor R102. The second side of resistor R102 is coupled to the voltage supply for the comparator 41, to one side of a capacitor C54, and to a −5.2 volt power supply on a terminal 124. The second side of the capacitor C54 is coupled to ground potential.

The emitter terminal of the transistor Q66 is coupled to a −34 voltage supply on a terminal 126 through a resistor R104. The terminal 126 is also coupled to the anode of a diode D54. The cathode of the diode D54 is coupled to the gate terminal of the FET Q64. The gate terminal of the FET Q64 is also coupled to the anode of a diode D56, to the operating terminal of the relay K3, and to the gate terminal of an FET Q68. The cathode of the diode D56 is coupled to ground potential. The source terminal of the FET Q68 is connected to the source terminal of the FET Q60, and this connection is coupled to the collector terminal of a transistor Q70. The base terminal of the transistor Q70 is coupled to a −30.4 volt power supply on a terminal 127, and to the base terminal of the transistor Q66. The emitter terminal of the transistor Q70 is coupled to a −34 volt power supply on a terminal 128 through a resistor R105. A capacitor C56 is coupled between the terminal 128 and ground potential.

The drain terminal of the FET Q60 is coupled to one side of a resistor R106, and the second side of the resistor R106 is coupled to a first terminal of a potentiometer R108. The drain terminal of the FET Q60 is also coupled to a non-inverting input of the comparator 40. The drain terminal of the FET Q68 is coupled to one side of a resistor R109, and the second side of the resistor R109 is coupled to the second terminal of the potentiometer R108. The wiper of the potentiometer R108 is coupled to ground potential. In one embodiment the resistors R106 and R109 have a value of 100 ohms, and are ⅛ watt resistors with 1% tolerance. Also in one embodiment Q60 and Q68 are fabricated on the same semiconductor chip to match device characteristics. The drain terminal of the FET Q68 is also coupled to the inverting input of the comparator 40, and to one side of a resistor R110. The second side of the resistor R110 is coupled to the inverted output of the comparator R40 and to the comparator 19 output which is connected to the multiplexer 46 at AND gate 48 thereof.

Referring now to FIG. 7, the operating coils for the relays K1 through K5 are illustrated in schematic diagram form. The coils of the relays K1 through K5, referred to herein as K1' through K5' are coupled between one side of a capacitor C60 and to the anode of diode D60 through D64, respectively. The cathodes of the diodes D60 through D64 are coupled to terminals 130 through 134, respectively. Terminals 130 through 134 are coupled to the test system computer 12. The signal supplied to the terminal 130 is referred to herein as $\overline{PORCT}$ which signal is indicative of power, input/output relay control. This signal closes relay K1 when the designated pin 14' is programmed as an input pin, and input/output pin, or a power supply pin. The closing of relay K1, connects drive circuitry to the device under test 14. The signal supplied to the terminal 131 is referred to herein as $\overline{PMRCT}$, which signal is indicative of precision measurement relay control. This signal closes relay K2 when the designated pin 14' is programmed for a precision measurement. That is, the closing of this relay provides access to the program measurement 21 for the particular pin 14'. The signal supplied to the terminal 132 designated herein as PMRCT is indicative of precision measurement relay control Not or level detector relay control. This signal closes relay K3 when the designated pin 14' is programmed as an output pin and if that pin is not addressed by the precision measurement unit 21. The signal supplied to the terminal 133 is designated herein as $\overline{PSRCT}$ which is indicative of power supply relay control. This signal closes relay K4 when the designated pin 14' is programmed as a power supply pin. The closing of relay K4 provides a low-impedance path for the buffer amplifier to the DUT 14. The signal supplied to terminal 134 is designated herein as $\overline{CKRCT}$ and is indicative of clock relay control. This signal closes relay K5 when the designated pin 14' is programmed as a clock pin. The closing of relay K5 provides a greater drive current capability for larger capacitive load.

We claim:

1. In a testing circuit having a terminal disposed for connection to a device under test wherein a stimulus is supplied to the device under test in accordance with a first state of the testing circuit and a response is received from the device under test in accordance with a second state of the testing circuit, comprising:

a. driving circuit means disposed for supplying a test stimuli signal to the device under test during the first state of the testing circuit, said test stimuli signal being generated by said driving circuit means in response to the combination of a pulse code input signal and first and second reference voltage inputs, whereby said test stimuli signal has a frequency equal to said pulse code input signal, a first amplitude equal to said first reference voltage and a second amplitude equal to said second reference voltage;

b. comparing means disposed for providing an output signal indicating a pass and a failure of the device under test during the second state of the testing circuit and having a first input terminal coupled to the device under test and second and third input terminals coupled to third and fourth reference voltages, whereby the comparing means output signal indicates a pass test when the amplitude of the response from the device under test is equal to or exceeds the respective amplitudes of said third and fourth reference voltages, and the comparing means output signal indicates a fail test when the amplitude of the response from the device under test fails to meet or exceed said third and fourth reference voltage levels; said comparing means comprising a pair of comparator circuits, wherein a first input of a first one of said pair is coupled to said third reference voltage and a first input of a second one of said pair of coupled to said fourth reference voltage, and a second input of each of said pair is coupled to an output of the device under test; and c. a multiplexer circuit coupled between output terminals of said pair of comparators and the output terminal of said comparing means for switching between the output terminal of said pair of comparator circuits in accordance with the frequency of said pulse code input signal.

2. In a testing circuit as defined in claim 1 further characterized by means coupling said pulse code signal from said driving circuit means to said multiplexer circuit for synchronizing said comparing means with said test stimuli signal.

3. In a testing circuit as defined in claim 2 further characterized by a time delay means in said means coupling for compensating for circuit time delay between said pulse code signal rise time and said test stimuli signal to thereby compare responses from the device under test at the same time stimuli is supplied to the device under test.

4. A system for testing circuit devices having a plurality of input and output terminals wherein the system provides stimuli to and receives responses from the output terminals of the circuit devices, said system having a plurality of testing circuits each of which being disposed for connection to a respective terminal of such a circuit device, each of said testing circuits including:

a. driving circuit means disposed for supplying a test stimuli signal to the device under test during the first state of the testing circuit, said test stimuli signal being generated by said driving circuit means in response to the combination of a pulse code input signal and first and second reference voltage inputs, whereby said test stimuli signal has a frequency equal to said pulse code input signal, a first amplitude equal to said first reference voltage and a second amplitude equal to said second reference voltage;

b. comparing means disposed for providing an output signal indicating a pass and a failure of the device under test during the second state of the testing circuit and having a first input coupled to the device under test and second and third inputs coupled to third and fourth reference voltages, whereby the comparing means output signal indicates a pass test when the amplitude of the response from the device under test is equal to or exceeds the respective amplitudes of said third and fourth reference voltages, and the comparing means output signal indicates a fail test when the amplitude of the response from the device under test fails to meet or exceed said third and fourth reference voltage levels;

wherein the improvement of said driving circuit means comprises:

c. skew adjustment circuit means disposed at the pulse code input of said driving circuit means for adjusting the time of occurence of the leading and trailing edges of said test stimuli signal from one of said testing circuits with respect to the time of occurence of the leading and trailing edges of said test stimuli signal from other ones of said testing circuits in said system, whereby stimuli is supplied to the circuit devices under test at substantially the same time.

5. A system as defined in claim 4 further characterized by said skew adjustment circuit comprising a resistor-capacitor network.

6. In a testing circuit having a terminal disposed for connection to a device under test wherein a stimulus is supplied to the device under test in accordance with a first state of the testing circuit and a response is received from the device under test in accordance with a second state of the testing circuit, including:
 a. driving circuit means disposed for supplying a test stimuli signal to the device under test during the first state of the testing circuit, including;
  i. gate driving means for generating two complementary switching signals in response to a pulse code input signal;
  ii. a first switching means having an operating terminal coupled to a first output of said gate driving means, an input terminal coupled to a first reference voltage and an output terminal coupled to the output of said driving circuit means; and,
  iii. a second switching means having an operating terminal coupled to a second output of said gate driving means, an input terminal coupled to a second reference voltage and an output terminal coupled to the output of said driving circuit means, whereby said test stimuli signal has a frequency equal to said pulse code input signal, a first amplitude equal to said first reference voltage and a second amplitude equal to said second reference voltage;
 b. comparing means disposed for providing an output signal indicating a pass and a failure of the device under test during the second state of the testing circuit and having a first input coupled to the device under test and second and third inputs coupled to third and fourth reference voltages, whereby the comparing means output signal indicates a pass test when the amplitude of the response from the device under test is equal to or exceeds the respective amplitudes of said third and fourth reference voltages, and the comparing means output signal indicates a fail test when the amplitude of the response from the device under test fails to meet or exceed said third and fourth reference voltage levels;

wherein the improvement of said driving circuit means comprises:
 c. amplitude limiting means disposed for mitigating the peak-to-peak amplitude of said two complementary switching signals to substantially eliminate glitches in said test stimuli signal during transitions thereof, said amplitude limiting means comprising a pair of constant current sources having a zener diode coupled therebetween, whereby said two complementary switching signals are limited in amplitude.

7. In a testing circuit having a terminal disposed for connection to a device under test wherein a stimulus in a testing circuit having a terminal disposed for connection to a device under test in accordance with a first state of the testing circuit and a response is received from the device under test in accordance with a second state of the testing circuit, comprising:
 a. a pair of comparator circuits disposed for providing an output signal indicating a pass and a failure of the device under test during the second state of the testing circuit, wherein a first input of a first one of said pair is coupled to a first reference voltage and a first input of a second one of said pair is coupled to a second reference voltage, and a second input of each of said pair is coupled to an output of the device under test; and,
 b. a multiplexer circuit coupled between output terminals of said pair of comparator circuits and the output terminal of said comparing means for switching between the output terminal of said pair of comparator circuits.

8. In a testing circuit having a terminal disposed for connection to a device under test wherein a stimulus is supplied to the device under test in accordance with a first state of the testing circuit and a response is received from the device under test in accordance with a second state of the testing circuit, comprising:
 a. amplitude limiting means disposed for eliminating undesired glitches in a test stimuli signal supplied to the device under test said amplitude limiting means comprising a pair of constant current sources and a zener diode coupled therebetween to thereby limit the amplitude of a switching signal used in generating said test stimuli signal to a voltage determined by the voltage across said zener diode.

* * * * *